United States Patent
Ninan et al.

(10) Patent No.: US 10,700,052 B2
(45) Date of Patent: Jun. 30, 2020

(54) PIXEL TILE STRUCTURES AND LAYOUTS

(71) Applicant: Dolby Laboratories Licensing Corporation, San Francisco, CA (US)

(72) Inventors: Ajit Ninan, San Jose, CA (US);
Tyrome Y. Brown, Mountain View, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 64 days.

(21) Appl. No.: 15/542,854

(22) PCT Filed: Jan. 11, 2016

(86) PCT No.: PCT/US2016/012875
§ 371 (c)(1),
(2) Date: Jul. 11, 2017

(87) PCT Pub. No.: WO2016/115040
PCT Pub. Date: Jul. 21, 2016

(65) Prior Publication Data
US 2018/0006011 A1    Jan. 4, 2018

Related U.S. Application Data

(60) Provisional application No. 62/102,534, filed on Jan. 12, 2015.

(51) Int. Cl.
*H01L 27/32* (2006.01)
*G02F 1/1333* (2006.01)
(Continued)

(52) U.S. Cl.
CPC ...... *H01L 27/0207* (2013.01); *G02F 1/13336* (2013.01); *G02F 1/134309* (2013.01);
(Continued)

(58) Field of Classification Search
CPC ............... H01L 33/005; H01L 27/0207; H01L 27/3293; H01L 27/3218; H01L 27/156;
(Continued)

(56) References Cited

U.S. PATENT DOCUMENTS 5,056,893 A * 10/1991 Holz ................. G02F 1/134336
349/143
5,824,186 A    10/1998 Smith
(Continued)

FOREIGN PATENT DOCUMENTS

CN            1299501       6/2001
CN          101325026      12/2008
(Continued)

OTHER PUBLICATIONS

Ali S., "Fabrication and characterization of ZnO nanostructures for sensing and photonic device applications", Linkoping studies in Science and Technology, Dissertation No. 1412, Linkoping University, XP055329673, pp. 1-76, Nov. 1, 2011.

*Primary Examiner* — Michael M Trinh

(57) ABSTRACT

An overall displacement tolerance applicable to each pixel tile in a plurality of pixel tiles to be used as parts of an image rendering surface is determined. Each pixel tile in the plurality of pixel tiles comprises a plurality of sub-pixels. Random displacements are generated in each pixel tile in the plurality of pixel tiles based on the overall displacement tolerance. The plurality of image rendering tiles with the random displacements are combined into the image rendering surface.

8 Claims, 13 Drawing Sheets

(51) Int. Cl.
    *H01L 27/02*     (2006.01)
    *H01L 23/00*     (2006.01)
    *G02F 1/1343*     (2006.01)
    *H01L 27/15*     (2006.01)
    *H01L 33/00*     (2010.01)

(52) U.S. Cl.
    CPC ............ H01L 24/00 (2013.01); H01L 27/156 (2013.01); H01L 33/005 (2013.01); *G02F 2001/134345* (2013.01); *G02F 2201/14* (2013.01); *G02F 2201/52* (2013.01); *H01L 27/3218* (2013.01); *H01L 27/3293* (2013.01); *H01L 2224/95136* (2013.01); *H01L 2924/10155* (2013.01); *H01L 2924/12041* (2013.01); *H01L 2924/12044* (2013.01); *H01L 2924/1433* (2013.01); *H01L 2924/3511* (2013.01)

(58) Field of Classification Search
    CPC ........... G02F 1/13336; G02F 1/133354; G02F 1/134336; G02F 1/134309; G02F 2201/14; G02F 2201/52; G02F 2001/134345
    See application file for complete search history.

(56) References Cited

U.S. PATENT DOCUMENTS

| | | | |
|---|---|---|---|
| 5,824,379 | A | 10/1998 | Riley |
| 6,091,332 | A | 7/2000 | Eberhardt |
| 6,218,942 | B1 | 4/2001 | Vega |
| 6,274,508 | B1 | 8/2001 | Jacobsen |
| 6,433,702 | B1 | 8/2002 | Favreau |
| 6,606,247 | B2 | 8/2003 | Credelle |
| 6,683,663 | B1 | 1/2004 | Hadley |
| 6,784,856 | B2 | 8/2004 | Berstis |
| 6,833,932 | B1 | 12/2004 | Thomas |
| 6,914,651 | B1 | 7/2005 | Fujishiro |
| 6,985,196 | B2 | 1/2006 | Otake |
| 7,084,940 | B2 | 8/2006 | Nimura |
| 7,414,621 | B2 | 8/2008 | Yavid |
| 7,542,301 | B1 | 6/2009 | Liong |
| 8,246,773 | B2 | 8/2012 | Green |
| 2003/0128179 | A1 | 7/2003 | Credelle |
| 2004/0188531 | A1 | 9/2004 | Gengel |
| 2004/0196215 | A1 | 10/2004 | Duthaler |
| 2005/0141573 | A1 | 6/2005 | Yavid |
| 2006/0044215 | A1* | 3/2006 | Brody .................. G06F 3/1446 345/1.3 |
| 2007/0176854 | A1* | 8/2007 | Ward ..................... G09F 19/22 345/44 |
| 2009/0038683 | A1 | 2/2009 | Walter |
| 2011/0157672 | A1 | 6/2011 | Liu |
| 2013/0235354 | A1 | 9/2013 | Kilcher |
| 2014/0111115 | A1* | 4/2014 | Bai .................. G02F 1/134309 315/312 |
| 2016/0275846 | A1* | 9/2016 | Gu ....................... G09G 3/2074 |

FOREIGN PATENT DOCUMENTS

| | | |
|---|---|---|
| JP | 9-54323 | 2/1997 |
| JP | H10-260644 | 9/1998 |
| JP | 2001-022302 | 1/2001 |
| JP | 2002-513980 | 5/2002 |
| JP | 2003-029667 | 1/2003 |
| JP | 2003-133686 | 5/2003 |
| JP | 2006-113258 | 4/2006 |
| JP | 2007-521519 | 8/2007 |
| JP | 2007-325202 | 12/2007 |
| JP | 2008-516286 | 5/2008 |
| JP | 2008-198387 | 8/2008 |
| JP | 2009-516382 | 4/2009 |
| JP | 2010-015163 | 1/2010 |
| JP | 2010-044420 | 2/2010 |
| JP | 2010-117494 | 5/2010 |
| JP | 2010-282009 | 12/2010 |
| JP | 2011-075825 | 4/2011 |
| JP | 2011-138126 | 7/2011 |
| JP | 5192446 | 5/2013 |
| JP | 2013-530418 | 7/2013 |
| WO | 2004/100117 | 11/2004 |
| WO | 2007/087376 | 8/2007 |
| WO | 2013/051063 | 4/2013 |

* cited by examiner

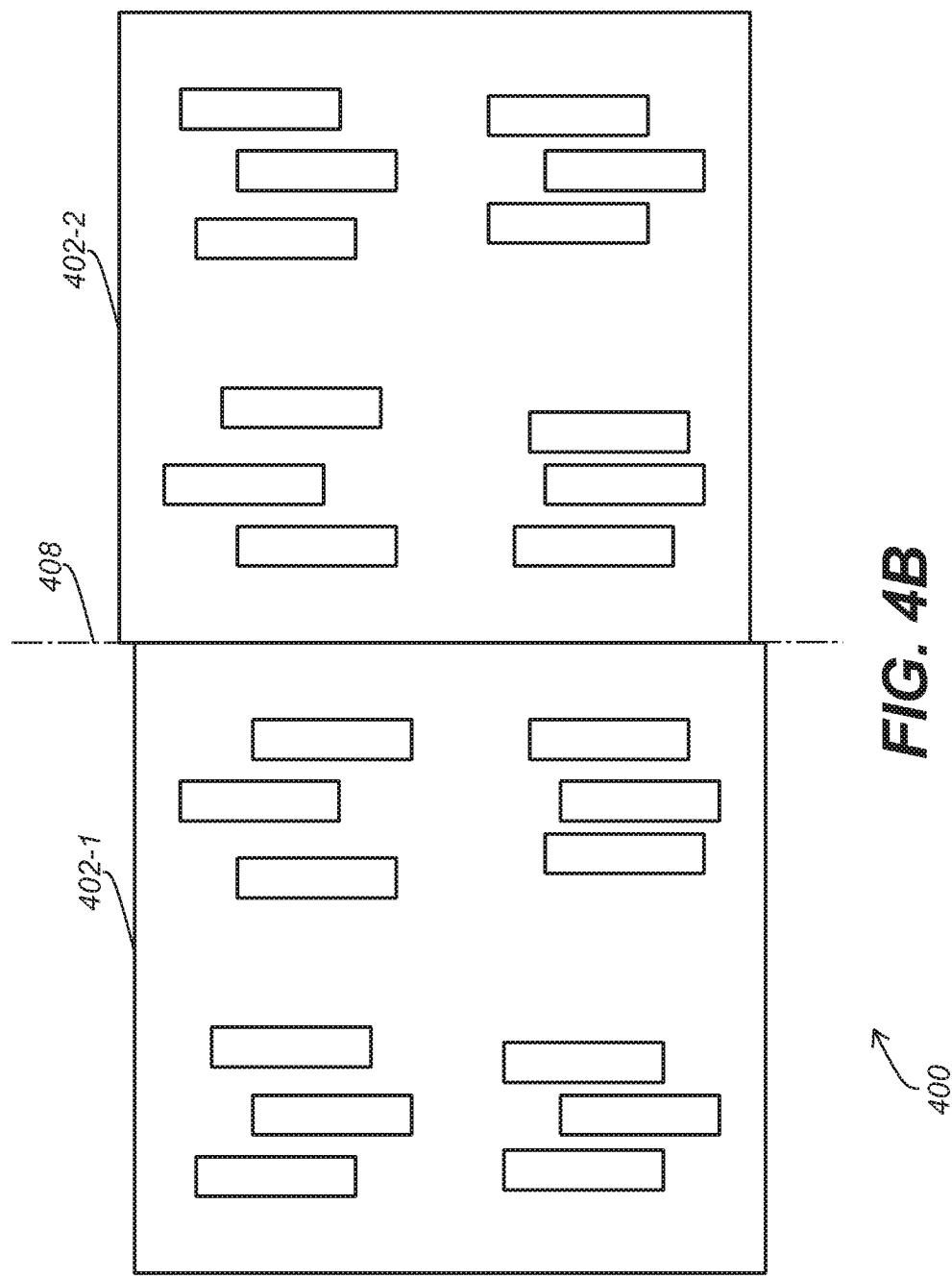

PIXEL TILE STRUCTURES AND LAYOUTS

CROSS-REFERENCE TO RELATED APPLICATIONS

This application claims the benefit of priority to U.S. Provisional Patent Application No. 62/102,534 filed 12 Jan. 2015, the contents of which are hereby incorporated by reference in their entirety.

TECHNOLOGY

The present invention relates generally to display techniques, and in particular, to pixel tile structures and layouts.

BACKGROUND

Engineering a large-size display panel with high spatial resolution, wide color gamut, and high luminance range has been recognized as a difficult endeavor by many display manufactures. Because of a relatively high number of relatively expensive optical, audio, electronic and mechanical components involved and complexity in integrating all of them in numerous pixels of a single display system, the cost of manufacturing a high-end display system is typically very high.

Various types of visible artifacts can be introduced in manufacturing a relatively large-size display panel. For example, spatial errors may easily occur when placing pixels onto a monolithic large-size display panel, especially in edge regions of the display panel. Alternatively, a relatively large-size display panel can be made by combining multiple relatively small tiles. However, small misalignments at boundaries separating adjacent tiles in the display panel can appear especially pronounced visually.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which:

FIG. 4A through FIG. 4D illustrate sub-pixel level random displacements in pixel tiles of an image rendering surface;

DESCRIPTION OF EXAMPLE POSSIBLE EMBODIMENTS

Figure 1A:
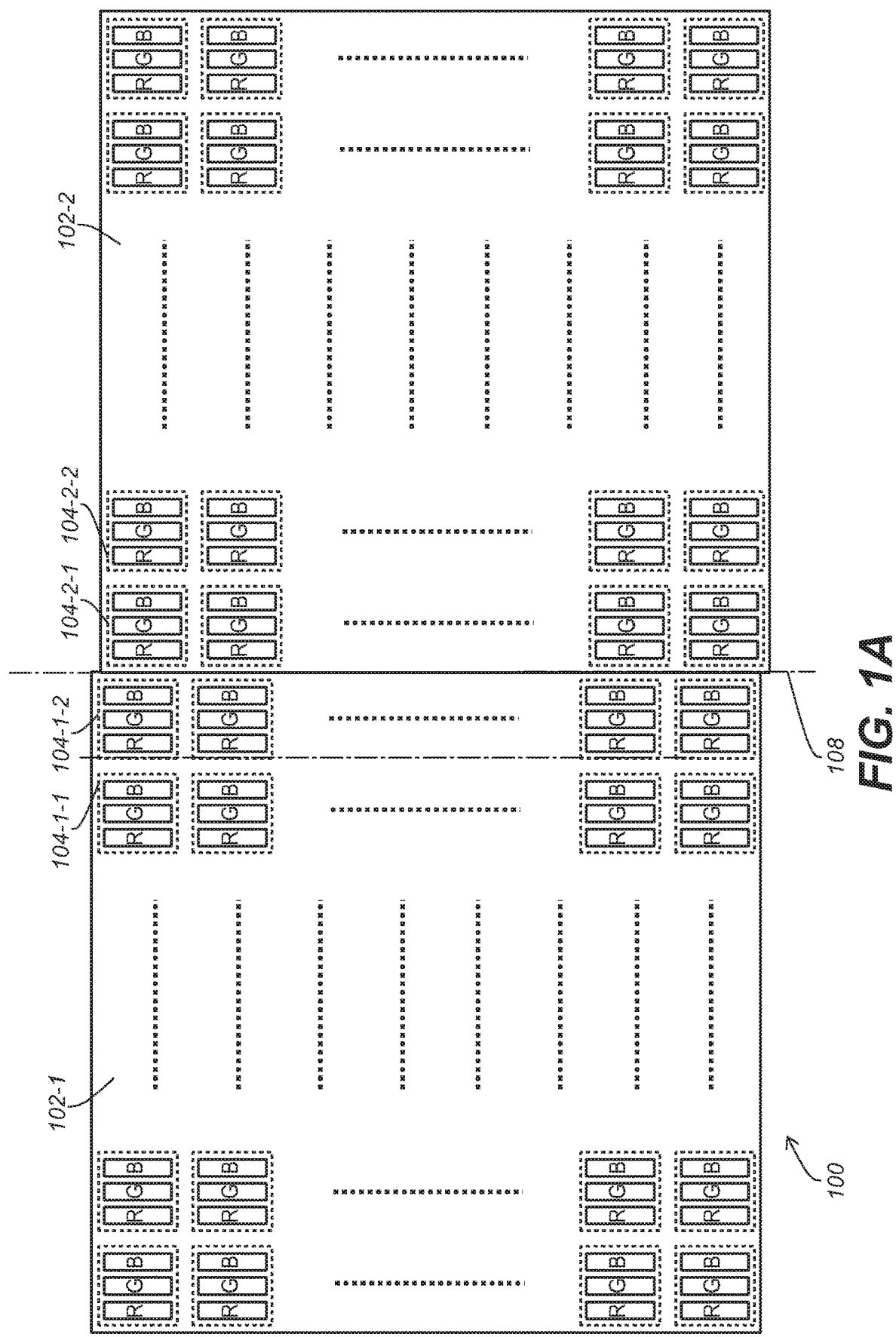
FIG. 1A illustrates an example image rendering surface.

Example possible embodiments, which relate to pixel tile structures and layouts, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:

1. GENERAL OVERVIEW
2. STRUCTURE OVERVIEW
3. AN EXAMPLE TILE PLACEMENT SYSTEM
4. PIXEL LEVEL VARIATIONS OF VISUAL CHARACTERISTICS
5. SUB-PIXEL LEVEL VARIATIONS OF VISUAL CHARACTERISTICS
6. DIFFERENT TYPES OF IMAGE RENDERING SURFACES
7. RANDOM DISPLACEMENTS WITH FLUIDIC SELF ASSEMBLY
8. EXAMPLE DISPLAY SYSTEM
9. EXAMPLE PROCESS FLOW
10. IMPLEMENTATION MECHANISMS—HARDWARE OVERVIEW
11. EQUIVALENTS, EXTENSIONS, ALTERNATIVES AND MISCELLANEOUS

1. General Overview

This overview presents a basic description of some aspects of a possible embodiment of the present invention. It should be noted that this overview is not an extensive or exhaustive summary of aspects of the possible embodiment. Moreover, it should be noted that this overview is not intended to be understood as identifying any particularly significant aspects or elements of the possible embodiment, nor as delineating any scope of the possible embodiment in particular, nor the invention in general. This overview merely presents some concepts that relate to the example possible embodiment in a condensed and simplified format, and should be understood as merely a conceptual prelude to a more detailed description of example possible embodiments that follows below.

To avoid high costs and technical difficulties in creating monolithic large-size image rendering surfaces (e.g., smaller than 5 feet, 5 feet, 7 feet, 10 feet, theater sizes, cinema sizes, outdoor displace sizes, etc.), a large-size image rendering surface can be created by combining multiple pixel tiles.

However, at tile boundaries, placement tolerances, even submicron misalignments, between adjacent tiles can be perceptible to the human visual system when pixels in the tiles are arranged in regular patterns such as matrix patterns, diagonal patterns, concentric patterns, etc. A regular pattern as described herein may refer to a pattern formed through repetitions of constant steps, or a pattern formed through repetitions of constant steps plus or minus a spatial variation (e.g., 1%, 2%, etc.) that is small as compared with spatial misalignments that occur in placing and combining pixel tiles.

Under techniques as described herein, spatial errors or misalignments caused by a tile placement module may be measured. These spatial errors can be analyzed and used to set an overall displacement tolerance for pixel or sub-pixel random placements introduced on purpose. Random displacements at pixel level or sub-pixel level are injected into each pixel tile of multiple pixel tiles that are to be assembled into an image rendering surface. These random displacements can be either isotropic or anisotropic, so long as they avoid or substantially remove visual perceptibility of misalignment in adjacent pixel tiles.

A wide variety of random displacements at pixel level or sub-pixel level can be used by techniques as described herein. In an example, random displacements as described herein can be implemented by placing pixels in positions with randomized spatial distances and/or spatial angles to the pixels' assigned positions that form a regular pattern. In another example, random displacements as described herein can be implemented by placing sub-pixels in positions with randomized spatial distances and/or spatial angles to the sub-pixels' assigned positions that form a regular pattern. In a further example, random displacements as described herein can be implemented by combining randomized displacements at both pixel and sub-pixel levels.

Additionally, optionally, or alternatively, random displacements as described herein can be implemented by (e.g., randomly, pseudo-randomly, etc.) varying pixel density, spacing between pixels and/or between sub-pixels, pixel heights, pixel widths, pixel diameters, pixel pitches, sub-pixel heights, sub-pixel widths, sub-pixel diameters, sub-pixel pitches, spatial orders in arranging colored sub-pixels in a pixel, etc.

As a result, under techniques as described herein, a visually noticeable breakage of regular pixel or sub-pixel patterns does not occur across boundaries separating pixel tiles in an image rendering surface.

A wide variety of display technologies, placement technologies, etc., can benefit from techniques as described herein. Image rendering surfaces as described herein can be created by one or more of mask-based technologies, printing-based technologies including but not limited to 3D printing technologies, deposit-based technologies, semiconductor-wafer-based technologies, robotic-arm-based technologies, membrane-based technologies, laser-based technologies, nanotube-based technologies, fluidic self-assembly (FSA) technologies, roll-to-roll or web processing technologies, etc.

In some embodiments, accuracies, errors, etc., in the placement of pixel tiles in with these technologies can be measured and analyzed to generate overall displacement tolerances that are used to control and inject random displacements at pixel-block level, pixel level, sub-pixel level, etc., for the purpose of avoiding or reducing visual artifacts in image rendering surfaces. Pixel tiles can be created in relatively small sizes such as 2 inches, 5 inches, 12 inches, 24 inches, etc., at relatively low costs. These pixel tiles (which may or may not be of various different shapes) can be used to construct image rendering surfaces of much larger sizes (e.g., 5 feet, 7 feet, 10 feet, theater sizes, cinema sizes, outdoor displace sizes, etc.) also at relatively low costs. Exact alignments of pixel tiles at a precision level of no more than a tiny fraction of pixel sizes or sub-pixel sizes are not necessary under pixel tile placement technologies as described herein.

Additionally, optionally, or alternatively, these techniques can also work with a wide variety of substrates, materials, etc., used to create image rendering surfaces such as color pigments, phosphorous materials, quantum dots, light emitting diodes (LEDs), organic emitting diodes (OLEDs), nanotubes or nano-wired LEDs, glass, semiconductor wafer, metal, transparent conducting films, resin, canvas, optical films, light guides, irregular recesses on substrates, shaped components to be deposited into irregular recesses on substrates, flexible substrates such as polyethylene terephthalate or PET rolls, thermoplastic polymer resin, etc.

In some embodiments, a method comprises providing a display system as described herein. In some possible embodiments, mechanisms as described herein form a part of a system, including but not limited to a factory manufacturing system, a placement machine, a display system, an outdoor image display, a handheld device, game machine, television, laptop computer, netbook computer, cellular radiotelephone, electronic book reader, point of sale terminal, desktop computer, computer workstation, computer kiosk, PDA and various other kinds of terminals and display units.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Structure Overview

FIG. 1A illustrates an example image rendering surface 100. An image rendering surface as described herein may comprise two or more pixel tiles. For the purpose of illustration, as shown in FIG. 1A, the image rendering surface (100) comprises two pixel tiles 102-1 and 102-2. A pixel tile (e.g., 102-1, 102-2, etc.) as described herein may be of any of a wide variety of geometric shapes such as rectangular shape, triangular shape, elliptic shape, polygonal shape, etc. In some embodiments, an image rendering surface (e.g., 100) as described herein may comprise pixel tiles of the same geometric shape. In some embodiments, an image rendering surface (e.g., 100) as described herein may comprise pixel tiles of at least two different geometric shapes.

In some embodiments, as illustrated in FIG. 1A, a pixel tile (e.g., 102-1, 102-2, etc.) comprises a respective plurality of pixels arranged in a two-dimensional array in a geometric shape. For example, the pixel tile (102-1) comprises a first plurality of pixels such as 104-1-1, 104-1-2, etc., whereas the pixel tile (102-2) comprises a second plurality of pixels such as 104-2-1, 104-2-2, etc.

In some embodiments, a pixel (e.g., 104-1-1, 104-1-2, 104-2-1, 104-2-2, etc.) as described herein may comprise three or more sub-pixels of different types such as red, green and blue sub-pixels respectively denoted as "R", "G", and "B" in FIG. 1A. Sub-pixels (e.g., "R", "G", "B", etc.) representing a pixel (e.g., 104-1-1, 104-1-2, 104-2-1, 104-2-2, etc.) may be arranged as a single point or a single blot, as multiple points or multiple blots arranged in a linear or non-linear pattern, etc.

It is difficult to create a large-size image rendering surface in a monolithic manner. In display panels in which color filters in sub-pixels are created by filling color pigments with shadow masks (e.g., metallic shadow masks comprising partitions to fill or deposit color pigments, etc.), a single shadow mask for a large display panel may be too heavy and too large for backplanes, adjacent layers, structures, substrates, etc., to provide uniform mechanical support, prevent structural warping, etc. In display panels in which sub-pixels are individual colored light emitting diodes (LEDs) or individual (colored) organic light emitting diodes (OLEDs) positioned by mechanical arms, relatively large movement errors, positional errors, etc., may occur outside of a finite area (e.g., in a 12 inch radius, etc.). In image rendering surfaces generated by scanning lasers or electron beams with modulated intensities on phosphorous materials, quantum dots, etc., that are coated on the image rendering surfaces, relatively large point-spread-function related errors, positional errors, etc., may occur outside of a finite area (in which optical paths or electron beam paths are relatively short).

In some embodiments, an image rendering surface may be created or formed by a pixel tile level placement module that combines multiple pixel tiles (e.g., 102-1 and 102-2, etc.) each of which can be relatively precisely created by a sub-tile placement module.

A sub-tile placement module refers to a physical module or mechanism that put individual pixels or sub-pixels in their assigned positions within a pixel tile. Examples of sub-tile placement modules may include, but are not limited to only, any of: a placement machine with robotic arms to move and place components into a pixel tile; a laser with reflective mirrors and collimators that generates and directs light with modulated intensities onto a pixel tile coated with light conversion materials such as phosphorous materials, quantum dots, etc.; a placement machine with charged membrane to pick up, move and place components into a pixel tile; a surface on which nanotubes of specific diameters are grown to generate light of various wavelengths (e.g., corresponding to red, green, blue, etc.) at specific intensities (e.g., via pulse-width modulation or PWM, etc.); a fluidic self-assembly process to distribute or circulate shaped components into irregular recesses on a substrate (which may be singulated, cut, or divided into pixel tiles, display panels, etc.); etc.

A pixel-tile placement module refers to a physical module or mechanism that puts individual pixel tiles in their assigned positions within an image rendering surface. Examples of pixel-tile placement modules may include, but are not limited to only, any of: a placement machine with robotic arms to move and place pixel tiles into an image rendering; a laser control backplane with multiple lasers each of which operates with reflective mirrors and collimators to generate and direct light with modulated intensities onto a respective pixel tile coated with light conversion materials such as phosphorous materials, quantum dots, etc.; etc.

Combining pixel tiles into an image rendering surface can cause slight misalignments at boundaries (e.g., 108 of FIG. 1A, etc.) that join adjacent pixel tiles. While misalignments (e.g., 0.5 micrometer, etc.) between adjacent pixel tiles may be small as compared with a pixel size (e.g., 50 micrometers, etc.), a pixel tile size (e.g., 10 inches, etc.), it is still relatively easy for the human visual system to notice such irregularities in a regular pattern.

Figure 1B:
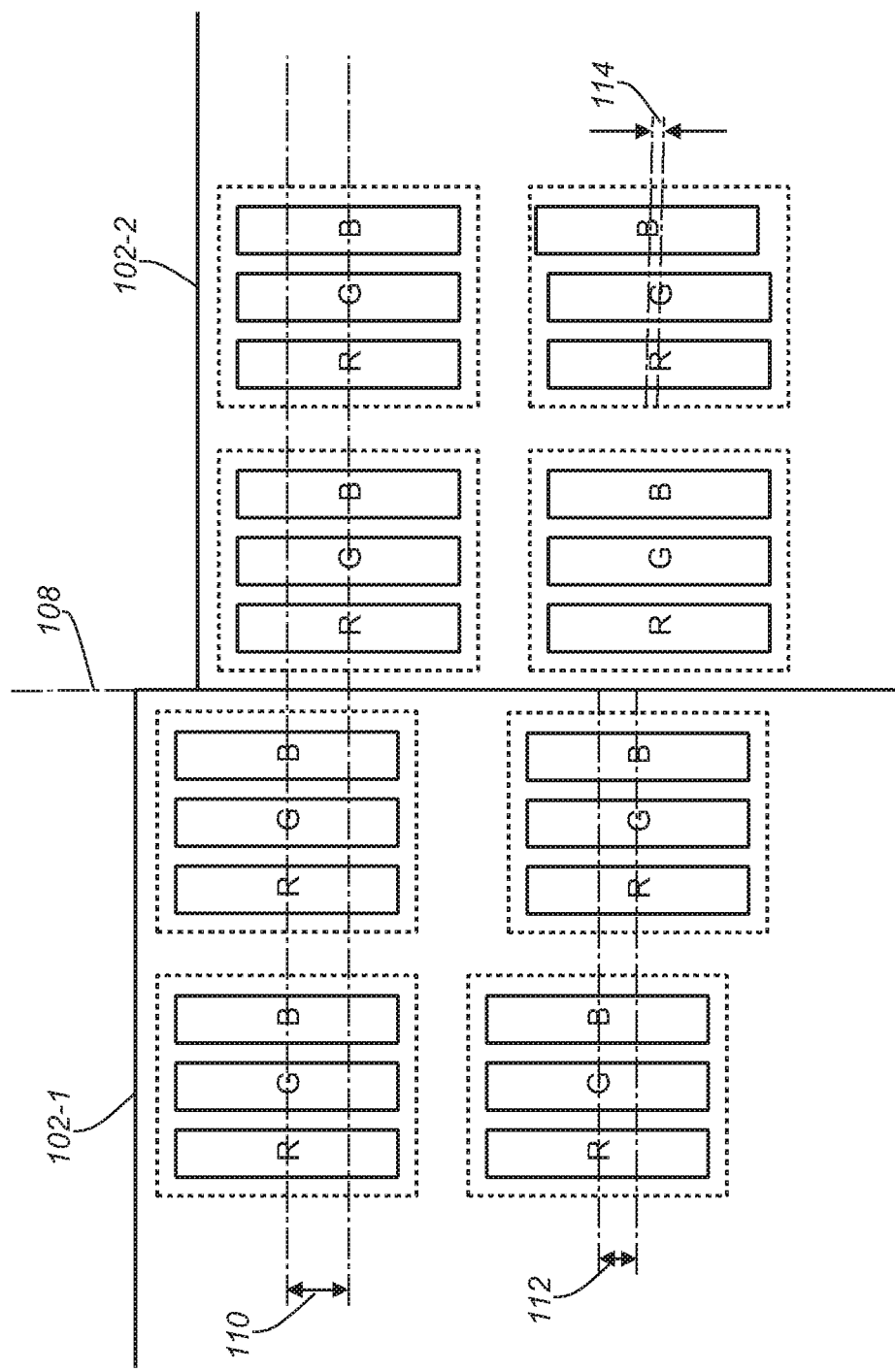
FIG. 1B illustrates example sub-pixel level misalignments, pixel level misalignments, and pixel-tile-level misalignments.

FIG. 1B illustrates example pixel-tile-level misalignments 110. As shown, the pixel-tile-level misalignments (110) may be caused by misaligning adjacent pixel tiles (e.g., 102-1 and 102-2, etc.) across boundaries (e.g., 108, etc.). In some embodiments, the pixel-tile-level misalignments (110) may be measured as differences between pixel lines located in different pixel tiles (e.g., 102-1 and 102-2, etc.). According to one or more embodiments of the present invention, pixel level misalignments (112) can be introduced with positions of pixels within a pixel tile (e.g., 102-1, etc.) to mitigate perception of pixel-tile-level misalignments 110. In some embodiments, the pixel level misalignments (112) may be measured as differences between an actual position of a pixel and an assigned position of the pixel within a pixel tile (e.g., 102-1, etc.). According to one or more alternative embodiments of the present invention, sub-pixel level misalignments (114) can be introduced with positions of sub-pixels within a pixel to mitigate perception of pixel-tile-level misalignments 110. In some embodiments, the sub-pixel-tile-level misalignments (114) may be measured as differences between an actual position of a sub-pixel and an assigned position of the sub-pixel within a pixel.

3. An Example Tile Placement System

Figure 2:
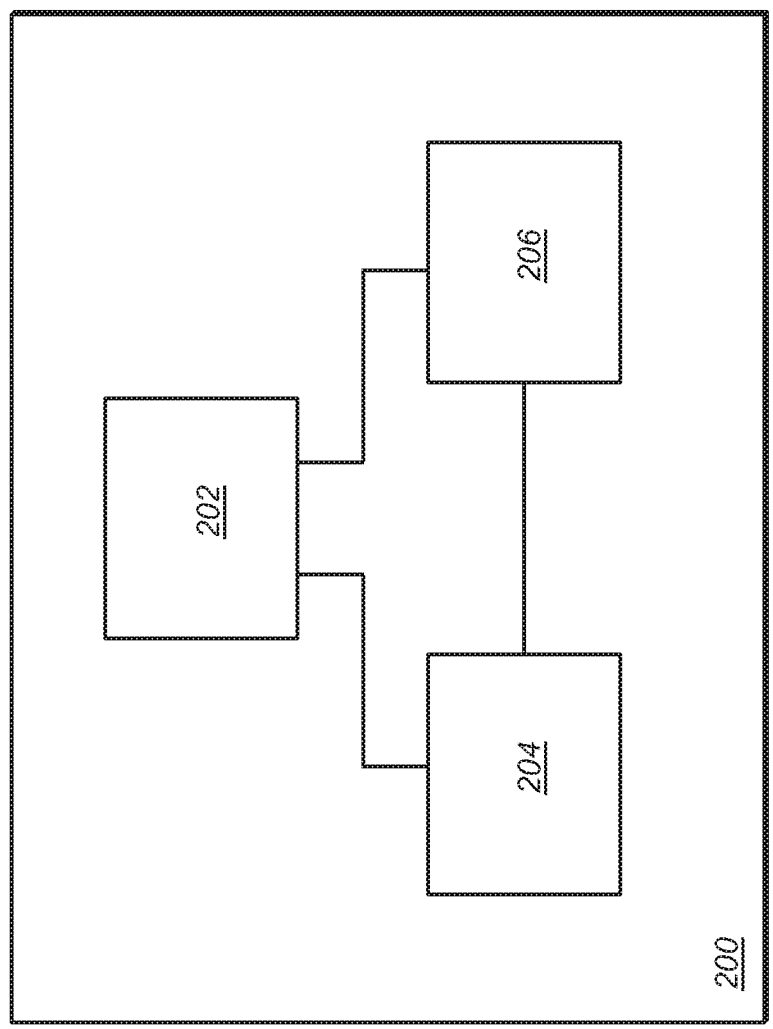
FIG. 2 illustrates an example tile placement system.

FIG. 2 illustrates an example tile placement system 200 configured to create an image rendering surface that is free of, or is of little, visual artifacts from misalignments between pixel tiles. In some embodiments, the tile placement system (200) comprises a placement controller 202 configured to perform overall controlling operations for the purpose of creating the image rendering surface, a sub-tile placement module 204 configured to perform pixel level or sub-pixel level placement operations within each of pixel tiles in the image rendering surface, a tile placement module 206 configured to perform tile level placement operations within the image rendering surface, etc.

In some embodiments, the sub-tile placement module (204) may represent only a pixel placement module that is configured to perform pixel level placement operations (e.g., for pre-fabricated pixels, for monochrome pixels, etc.).

In some embodiments, the sub-tile placement module (204) may represent only a sub-pixel placement module that is configured to perform sub-pixel level placement operations (e.g., pixel positions within a pixel tile are automatically set when sub-pixels are placed into the pixel tile, etc.).

In some embodiments, the sub-tile placement module (204) may represent a combined sub-tile placement module that is configured to perform pixel level placement operations as well as sub-pixel level placement operations.

In some embodiments, the sub-tile placement module (204) may comprise a pixel level placement sub-module and a sub-pixel level placement sub-module that are separate from each other.

The placement controller (202) may be configured to determine a group value for pixel-tile-level misalignments (e.g., 110, etc.) that can be caused by pixel tile placement operations performed by the tile placement module (206). Examples of group values may include, but are not limited to only, any of: a maximum value, an average value, a median value, a mode value, a statistic value, etc., among a plurality of pixel-tile-level misalignments (e.g., 110, etc.) that are generated in the pixel tile placement operations.

Additionally, optionally, or alternatively, the placement controller (202) may be configured to determine a group value for pixel level misalignments (e.g., 112, etc.) that can be caused by pixel placement operations performed by the sub-tile placement module (204). Examples of group values may include, but are not limited to only, any of: a maximum value, an average value, a median value, a mode value, a statistic value, etc., among a plurality of pixel level misalignments (e.g., 112, etc.) that are generated in the pixel placement operations.

Additionally, optionally, or alternatively, the placement controller (202) may be configured to determine a group value for sub-pixel level misalignments (e.g., 114, etc.) that can be caused by sub-pixel placement operations performed by the tile placement module (206). Examples of group values may include, but are not limited to only, any of: a maximum value, an average value, a median value, a mode value, a statistic value, etc., among a plurality of sub-pixel level misalignments (e.g., 114, etc.) that are generated in the sub-pixel placement operations.

The placement controller (202) can be configured to use one or more of the group value for pixel-tile-level misalignments, pixel level misalignments, sub-pixel level misalignments, etc., to determine an overall displacement tolerance for creating the image rendering surface. In some embodiments, the placement controller (202) sets the overall displacement tolerance to a specific one (e.g., the group value for pixel-tile-level misalignments, etc.) of the one or more of the group value for pixel-tile-level misalignments, pixel level misalignments, sub-pixel level misalignments, etc. In some embodiments, the placement controller (202) sets the overall displacement tolerance to the maximum value among the one or more of the group value for pixel-tile-level misalignments, pixel level misalignments, sub-pixel level misalignments, etc.

Based on the overall displacement tolerance, the placement controller (202) is configured to control the sub-tile placement module (204) to inject random displacements for pixels or sub-pixels in each of the pixel tiles that are to be combined into the image rendering surface. The placement controller (202) is further configured to control the pixel-tile-level placement module (206) to combine the pixel tiles, each of which has been injected the random displacements for pixels or sub-pixels, into the image rendering surface.

Techniques as described herein can support a wide variety of ways to inject random displacements for pixels or sub-pixels in a pixel tile based on an overall displacement tolerance for multiple pixel tiles of an image rendering surface.

4. Pixel Level Variations of Visual Characteristics

Figure 3A:
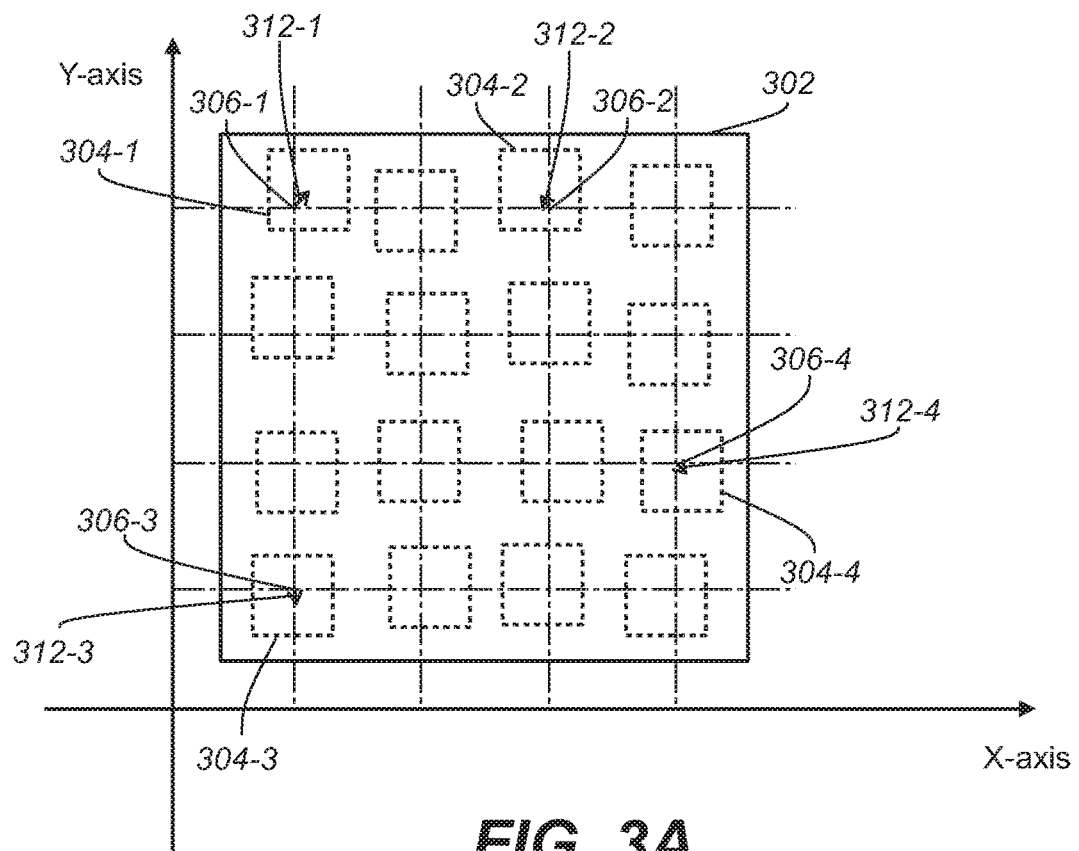
FIG. 3A and FIG. 3B illustrate pixel level random displacements in pixel tiles of an image rendering surface.

FIG. 3A illustrates non-uniform, uneven or random displacements (e.g., 312-1, 312-2, 312-3, 312-4, etc.) of the pixels (e.g., 304-1, 304-2, 304-3, 304-4, etc.) in the pixel tile (302). In some embodiments, the pixels (e.g., 304-1, 304-2, 304-3, 304-4, etc.) in the pixel tile (302) may correspond to respective assigned positions (e.g., 306-1, 306-2, 306-3, 306-4, etc.). In a non-limiting embodiment, an assigned position may be represented by a pair of coordinate values along X-axis and Y-axis. Assigned positions of pixels in a pixel tile as described herein may or may not form a regular pattern such as a matrix, diagonal lines, polygons, circles, etc. The displacements (e.g., 312-1, 312-2, 312-3, 312-4, etc.) in reference to the respective assigned positions (e.g., 306-1, 306-2, 306-3, 306-4, etc.) can be generated by a sub-tile placement module (e.g., 204 of FIG. 2, etc.) in a tile placement system (e.g., 200 of FIG. 2, etc.). The displacements (e.g., 312-1, 312-2, 312-3, 312-4, etc.) of the pixels (e.g., 304-1, 304-2, 304-3, 304-4, etc.) can be measured against the respective assigned positions (e.g., 306-1, 306-2, 306-3, 306-4, etc.) of the pixels (e.g., 304-1, 304-2, 304-3, 304-4, etc.).

Figure 3B:
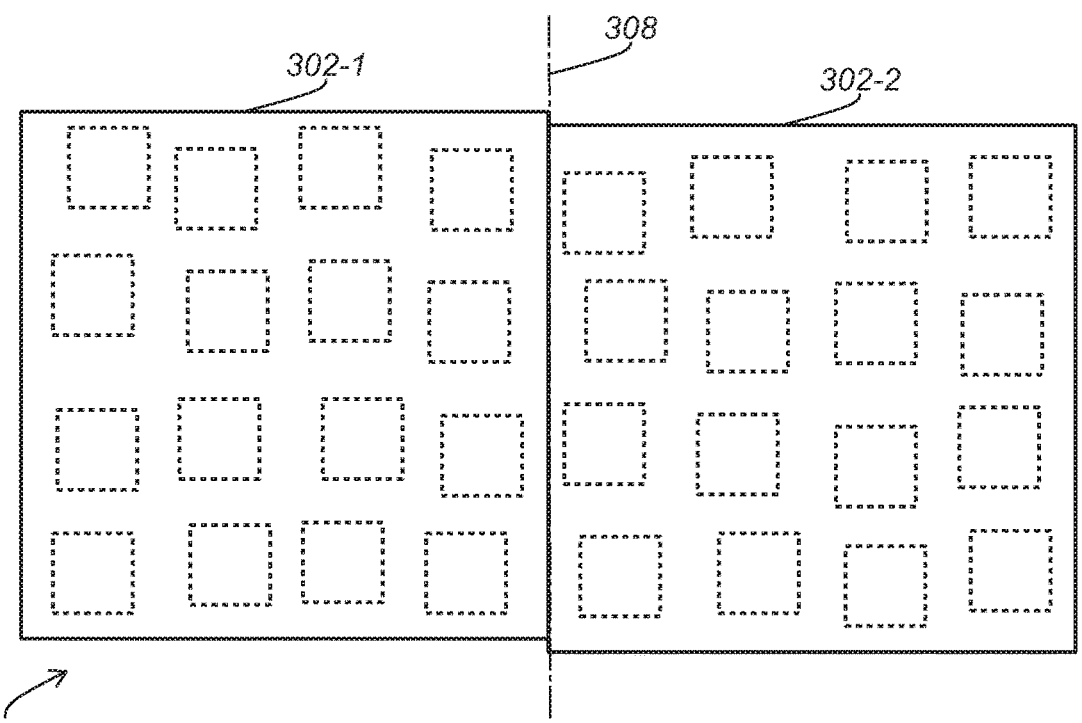

FIG. 3B illustrates an example image rendering surface 300 comprising two pixel tiles 302-1 and 302-1, each of which is created through non-uniform, uneven or random displacements (e.g., 312-1, 312-2, 312-3, 312-4, etc.) of pixels (e.g., 304-1, 304-2, 304-3, 304-4, etc.) in each of the pixel tiles (302-1 and 302-2). As shown, while the pixel tiles (302-1 and 302-2) is placed with misalignments along a boundary 308, the pattern formed by the pixels (e.g., 304-1, 304-2, 304-3, 304-4, etc.) in the resulting image rendering surface (300) that combines the pixel tiles (302-1 and 302-2) is free of, or is of little, visual artifacts from (or linked to) the misalignments between pixel tiles.

5. Sub-Pixel Level Variations of Visual Characteristics

Figure 4A:
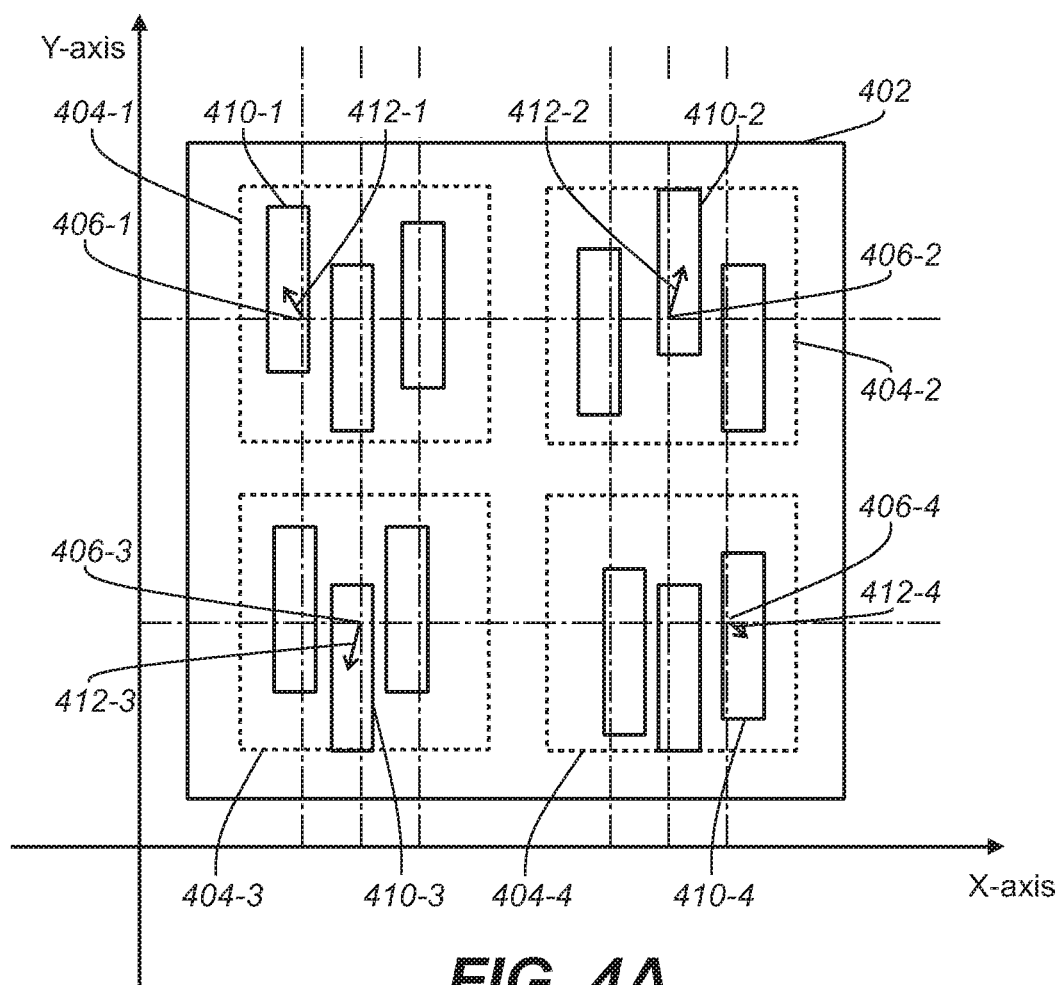

FIG. 4A illustrates non-uniform, uneven or random displacements (e.g., 412-1, 412-2, 412-3, 412-4, etc.) of the sub-pixels (e.g., 410-1, 410-2, 410-3, 410-4, etc.) in the pixel tiles (402). As shown, the sub-pixels (e.g., 410-1, 410-2, 410-3, 410-4, etc.) in the sub-pixel tile (402) may belong to different pixels (e.g., 404-1, 404-2, 404-3, 404-4, etc.) in the pixel tile (402). The sub-pixels (e.g., 410-1, 410-2, 410-3, 410-4, etc.) correspond to respective assigned positions (e.g., 406-1, 406-2, 406-3, 406-4, etc.). In a non-limiting embodiment, an assigned position may be represented by a pair of coordinate values along X-axis and Y-axis. Assigned positions of sub-pixels in a sub-pixel tile as described herein may or may not form a regular pattern such as a matrix, diagonal lines, polygons, circles, etc. The displacements (e.g., 412-1, 412-2, 412-3, 412-4, etc.) in reference to the respective assigned positions (e.g., 406-1, 406-2, 406-3, 406-4, etc.) can be generated by a sub-pixel level or sub-sub-pixel placement module (e.g., 204 of FIG. 2, etc.) in a sub-tile placement system (e.g., 200 of FIG. 2, etc.). The random displacements (e.g., 412-1, 412-2, 412-3, 412-4, etc.) of the sub-pixels (e.g., 410-1, 410-2, 410-3, 410-4, etc.) can be measured against the respective assigned positions (e.g., 406-1, 406-2, 406-3, 406-4, etc.) of the sub-pixels (e.g., 410-1, 410-2, 410-3, 410-4, etc.).

FIG. 4B illustrates an example image rendering surface 400 comprising two pixel tiles 402-1 and 402-2, each of which is created through non-uniform, uneven or random displacements (e.g., 412-1, 412-2, 412-3, 412-4, etc.) of sub-pixels (e.g., 410-1, 410-2, 410-3, 410-4, etc.) in each of the pixel tiles (402-1 and 402-2). As shown, while the pixel tiles (402-1 and 402-2) is placed with misalignments along a boundary 412, the pattern formed by the sub-pixels (e.g., 410-1, 410-2, 410-3, 410-4, etc.) in the resulting image rendering surface (400) that combines the pixel tiles (402-1 and 402-2) is free of, or is of little, visual artifacts from (or linked to) misalignments between pixel tiles.

Non-uniform, uneven or random displacements of pixels or sub-pixels as described herein (e.g., in reference to respective assigned positions of the pixels and sub-pixels, etc.) can be implemented as any of a wide variety of non-uniform spatial location arrangements. For example, the random displacements can be capped below a maximum displacement threshold such as 0.5%, 1%, 2%, 5%, etc., of a pixel dimension (e.g., pixel height, pixel width, pixel diameter, etc.), a sub-pixel dimension (e.g., sub-pixel height, sub-pixel width, sub-pixel diameter, etc.), etc. Additionally, optionally, or alternatively, the random displacements can be capped below a maximum displacement threshold determined in relation to one or more spatial dimensions of pixel tiles, image rendering surfaces, numbers of pixels, number of sub-pixels, etc.

In some embodiments, random displacements as described herein can be isotropic within an image rendering surface. Probability distributions of magnitudes of the random displacements can be non-directional, or same or similar in some or all of spatial directions, in the image rendering surface. Pixel tiles with isotropic random displacements can be used to join one another along a wide variety of boundaries of any contours, orientations, directions, etc.

In some embodiments, random displacements as described herein can be anisotropic within an image rendering surface. Probability distributions of magnitudes of the random displacements can be directional, comprise directional lobes, or favor one or more specific spatial directions, in the image rendering surface. Pixel tiles with anisotropic random displacements can be used to join one another along one or more specific boundaries of one or more specific contours, orientations, directions, etc. For example, random displacements may be implemented along Y-axis for pixel tiles that join with boundaries that are along Y-axis; as a result, misalignment along Y-axis is ameliorated or avoided.

Random displacements as described herein may, but are not limited to only, displacements that are truly random. In some embodiments, random displacements include pseudo-random displacements, directional displacements, etc., so long as these displacements avoid forming a pattern with visual artifacts in an image rendering surface that combines multiple pixel tiles. In some embodiments, a pixel tile as described herein may implement more than one type of (e.g., truly random, pseudo-random, directional, etc.) displacements, more than one type of probability distribution of displacements, etc. In some embodiments, one or more pixel tiles that implement random displacements as described herein may be combined with one or more pixel tiles that do not implement random displacements as described herein into a (e.g., contiguous, non-contiguous, etc.) image rendering surface. In some embodiments, one or more pixel tiles that form or provide an image rendering surface may have the same non-uniform pattern of displacements. Additionally, optionally, or alternatively, one or more non-uniform patterns of displacements can be repeated within a tile or between multiple tiles (e.g., +1, −2, −3, +1, +2 . . . +1, −2, −3, +1, +2, etc.).

In some embodiments, a (e.g., probability, etc.) distribution of random displacements in a pixel tile may be of the same group value as that represented by an overall displacement tolerance set for the pixel tile. In an example, when the overall displacement tolerance represents a maximum value, the distribution of the random displacements may be of a maximum value that is the same as the maximum value represented by the overall displacement tolerance. In another example, when the overall displacement tolerance represents an average value, the distribution of the random displacements may be of an average value that is the same as the average value represented by the overall displacement tolerance. In some embodiments, the overall displacement tolerance used by a tile placement system to control pixel level or sub-pixel level displacements within each pixel tile of an image rendering surface may comprise more than one group value, more than one group value type, etc. Correspondingly, the distribution of the random displacements implemented in such a pixel tile can be of more than one group value, more than one group value type, etc., some or all of which are the same as group values, group value types, etc., as represented by the overall displacement tolerance.

Techniques as described herein can be used to provide any of many different types of variations of visual properties at pixel tile level, pixel level, sub-pixel level, etc., in addition to or in place of random displacements of pixels or sub-pixels. For example, variations in one or more of local densities, pixel heights, pixel widths, pixel diameters, pixel pitches (e.g., inter-pixel distances, etc.) sub-pixel heights, sub-pixel widths, sub-pixel diameters, sub-pixel pitches (e.g., inter-sub-pixel distances within a pixel, etc.), etc., can be implemented in a pixel tile as described herein.

Figure 4C:
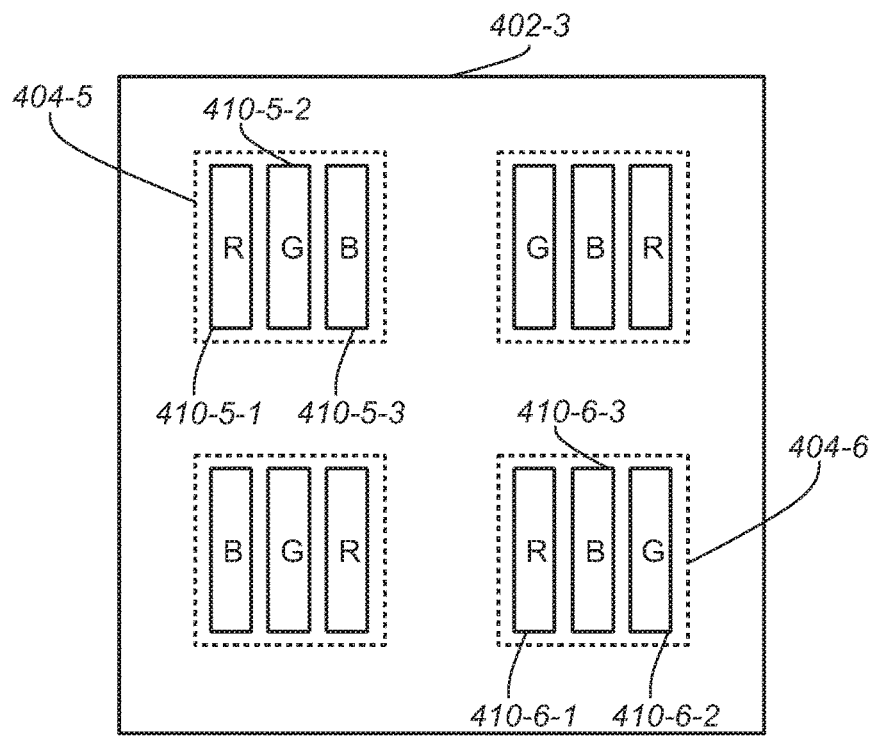

In some embodiments, sub-pixels (of different colors) in different pixels of a pixel tile as described herein may be arranged in different spatial orders. FIG. 4C illustrates an example pixel tile 402-3 comprising sub-pixels in a pixel arranged side-by-side. A pixel 404-5 comprises three sub-pixels 410-5-1, 410-5-2, and 410-5-3, which respectively correspond to red, green, and blue color sub-pixels arranged in a first order. In contrast, a pixel 404-6 comprises three sub-pixels 410-6-1, 410-6-2, and 410-6-3, which respectively correspond to red, green, and blue color sub-pixels arranged in a second order different from the first order.

Figure 4D:
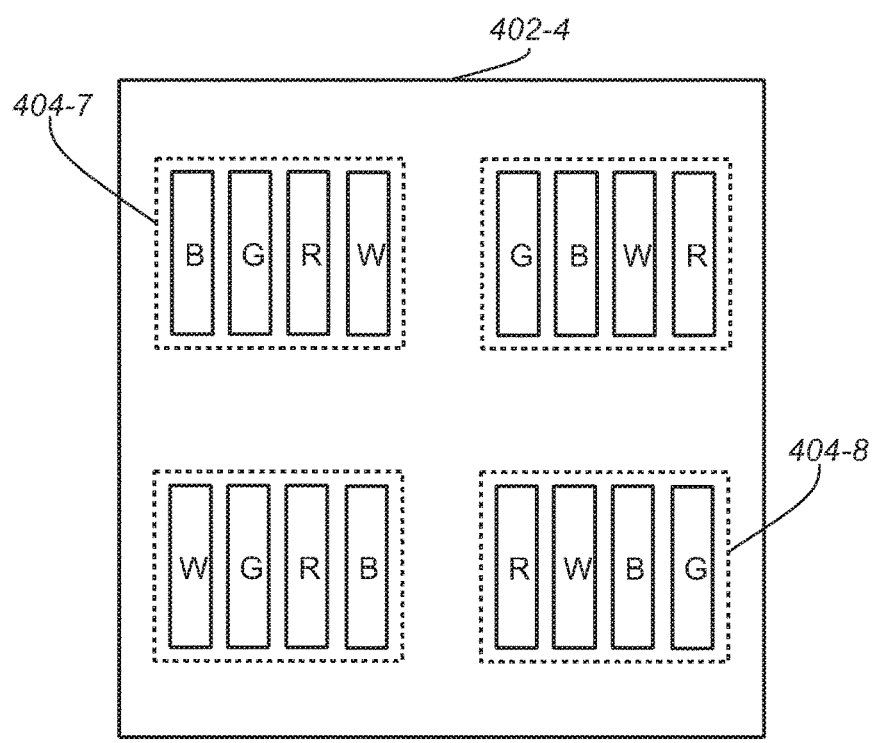

For the purpose of illustration only, it has been described that a pixel comprises sub-pixel of three primary colors, red, green and blue. It should be noted that in various embodiments, sub-pixels of other primary colors other than red, green and blue may be used in a pixel as described herein. Additionally, a pixel need not comprise only sub-pixels of three primary colors. In some embodiments, a pixel as described herein can comprise more or fewer primary colors. Additionally, optionally, or alternatively, in some embodiments, a pixel as described herein may comprise sub-pixel of non-primary colors, as illustrated in FIG. 4D, where a pixel may comprise a sub-pixel (denoted as "W") of white color in addition to sub-pixels of red, green and blue (denoted as "R", "G" and "B", respectively). Random displacements (e.g., variations of a wide variety of visual characteristics, etc.) at sub-pixel level can be implemented with respect to sub-pixels of various primary or non-primary colors in pixels.

Techniques as described herein can work with a wide variety of display technologies, placement technologies, etc., such as one or more of mask-based technologies, printing-based technologies including but not limited to 3D printing technologies, deposit-based technologies, semiconductor-wafer-based technologies, robotic-arm-based technologies, membrane-based technologies, laser-based technologies, nanotube-based technologies, fluidic self-assembly (FSA) technologies, roll-to-roll or web processing technologies, etc.

In some embodiments, accuracies, errors, etc., in the placement of pixel tiles in with these technologies can be measured and analyzed to generate overall displacement tolerances that are used to control and inject random displacements at pixel-block level, pixel level, sub-pixel level, etc., for the purpose of avoiding or reducing visual artifacts in image rendering surfaces.

Additionally, optionally, or alternatively, these techniques can also work with a wide variety of substrates, materials, etc., used to create image rendering surfaces such as glass, semiconductor wafer, metal, transparent conducting films, resin, canvas, optical films, light guides, irregular recesses on substrates, shaped components to be deposited into irregular recesses on substrates, flexible substrates such as polyethylene terephthalate or PET rolls, thermoplastic polymer resin, etc.

6. Different Types of Image Rendering Surfaces

Figure 5A:
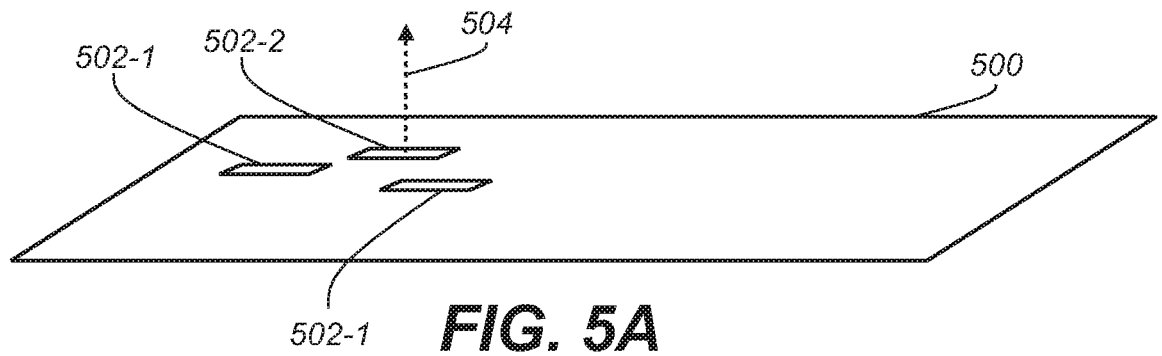
FIG. 5A through FIG. 5E illustrate various types of pixel tiles used to create image rendering surfaces.

FIG. 5A illustrates an example shadow mask 500 that may be used to create at least a part of a pixel tile as described herein. The shadow mask (500) comprises cells (e.g., 502-1, 502-2, 502-3, etc.) which can be used to place or deposit color pigments, phosphorous materials, quantum dots, etc., configured to emit modulated light along a light direction 504.

In other approaches, pixels and/or sub-pixels are placed into (assigned) positions as defined by a black matrix (which absorbs and prevents light pollution between nearby pixels or sub-pixels) in a regular pattern such as a matrix pattern, a diagonal line pattern, etc.

In contrast, under techniques as described herein, pixels and/or sub-pixels are placed into actual positions as defined by the cells (e.g., 502-1, 502-2, 502-3, etc.) in the shadow mask (500) in a non-uniform pattern. These actual positions comprise random displacements of the pixels and/or sub-pixels relative to respective assigned positions in a regular pattern.

Figure 5B:
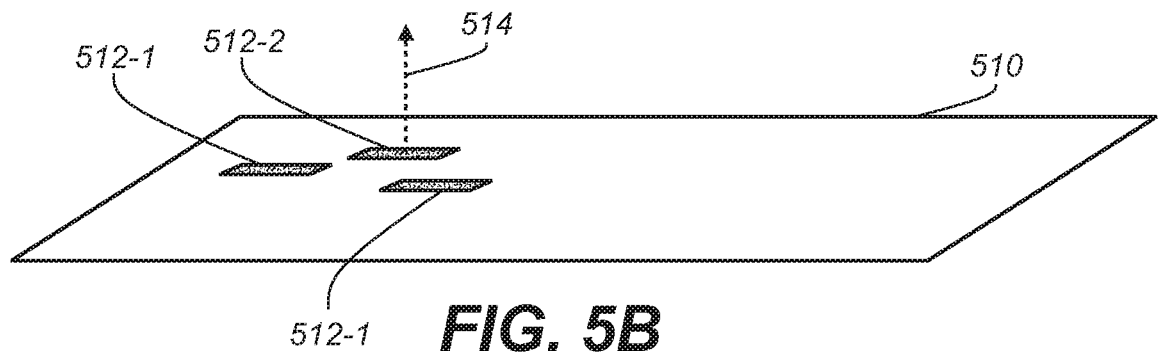

FIG. 5B illustrates an example substrate 510 (e.g., glasses, films, light guides, etc.) that may be used to create at least a part of a pixel tile as described herein. The substrate (510) may comprise surface areas (e.g., 512-1, 512-2, 512-3, etc.) which can be printed on with phosphorous materials, quantum dots, etc., configured to emit modulated light along a light direction 514.

In other approaches, pixels and/or sub-pixels are placed into (assigned) positions in a regular pattern such as a matrix pattern, a diagonal line pattern, etc.

In contrast, under techniques as described herein, pixels and/or sub-pixels are placed into actual positions as defined by the surface areas (e.g., 512-1, 512-2, 512-3, etc.) in the substrate (510) in a non-uniform pattern. These actual positions comprise random displacements of the pixels and/or sub-pixels relative to respective assigned positions in a regular pattern.

Figure 5C:
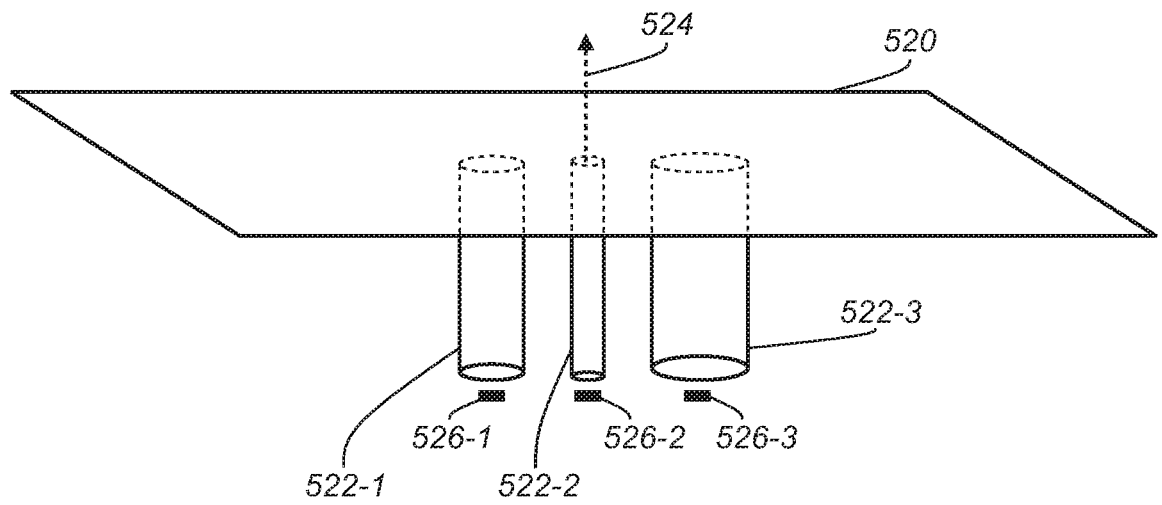

FIG. 5C illustrates an example substrate 520 (e.g., glasses, etc.) that may be used to create at least a part of a pixel tile as described herein. Nanotubes (e.g., 522-1, 522-2, 522-3, etc.), or nano-wired LEDs, may be grown on or from the substrate (520). The nanotubes (e.g., 522-1, 522-2, 522-3, etc.) can be configured with different diameters to emit modulated light of different colors along a light direction 524 when applied a voltage between two ends of each of the nanotubes (e.g., 522-1, 522-2, 522-3, etc.). The intensity of light emitted from each of the nanotubes (e.g., 522-1, 522-2, 522-3, etc.) can be controlled by pulse-width-modulation (PWM) techniques. In a non-limiting example, a thin film conducting film can be coated with the substrate (520) to provide a common electrode of a first polarity, whereas a metallic blob among a plurality of disjoint metallic blobs can be placed in opposition to the thin film at the other end of each of the nanotubes (e.g., 522-1, 522-2, 522-3, etc.) to provide a pixel electrode of a second polarity opposite to the first polarity of the common electrode.

Under techniques as described herein, pixels and/or sub-pixels are placed into actual positions as defined by the nanotubes (e.g., 522-1, 522-2, 522-3, etc.) in the substrate (520) in a non-uniform pattern. These actual positions comprise random displacements of the pixels and/or sub-pixels relative to respective assigned positions in a regular pattern.

Figure 5D:
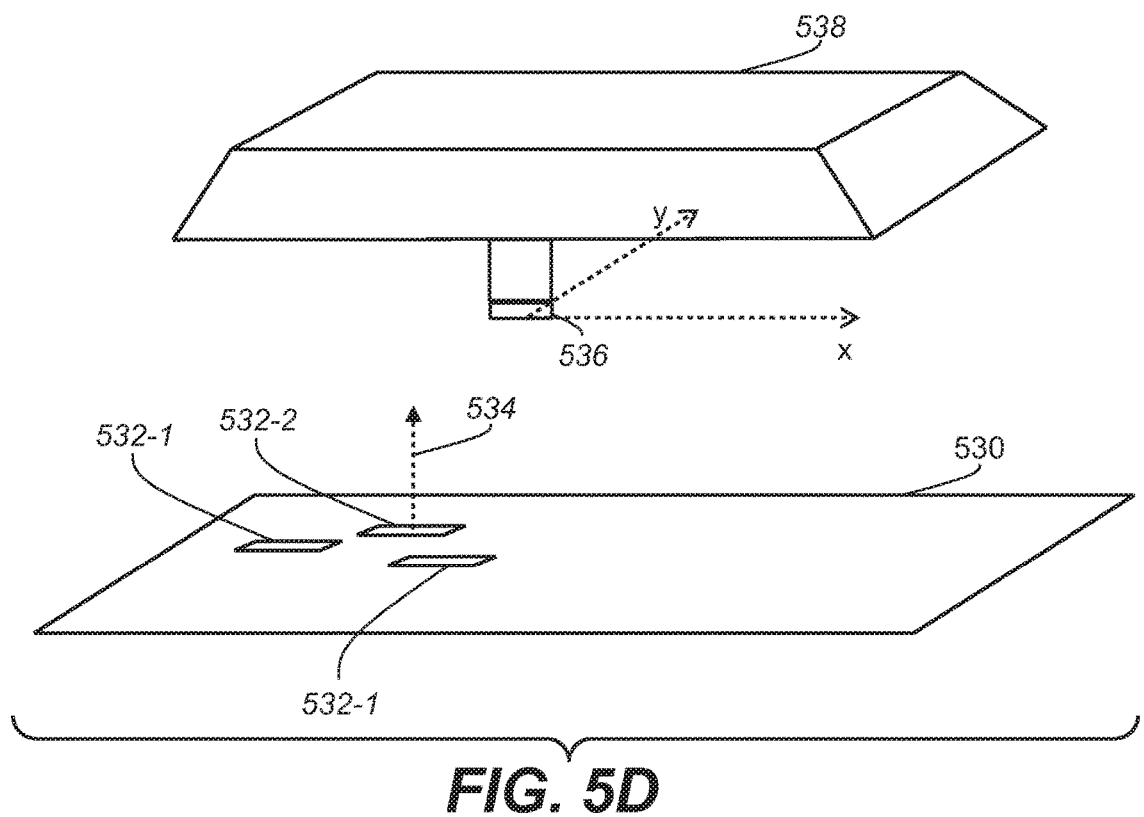

FIG. 5D illustrates an example backplane 530 that may be used to create at least a part of a pixel tile as described herein. A placement apparatus 538 with a robotic arm 536 that can move in x and y directions may fetch, transport, and place LED components of different light colors (e.g., red LEDs, green LEDs, blue LEDs, etc.) into positions (e.g., 532-1, 532-2, 532-3, etc.) on the backplane (530). In some embodiments, the LED components may be of a size such as 30 microns by 30 microns, 50 microns by 20 microns, etc. The LED components may represent pixels and/or sub-pixels, as mounted or located at the positions (e.g., 532-1, 532-2, 532-3, etc.) on the backplane (530), configured to emit modulated light along a light direction 534.

Under techniques as described herein, pixels and/or sub-pixels are placed into actual positions (e.g., 532-1, 532-2, 532-3, etc.) in a non-uniform pattern. These actual positions comprise random displacements of the pixels and/or sub-pixels relative to respective assigned positions in a regular pattern.

In some embodiments, to fetch or pickup pixel or sub-pixel components (e.g., red LEDs, green LEDs, blue LEDs, etc.) of relatively tiny sizes, the robotic arm (336) may be implemented in the form of a membrane-based pickup mechanism, rather than mechanic arms. A membrane in the pickup mechanism can be charged with a first charge type (e.g., positive charges, etc.), whereas the pixel or sub-pixel components can be charged with a second charge type (e.g., negative charges, etc.) opposite to the first charge type. The opposite charge types respectively in the pickup mechanism and the pixel or sub-pixel components may be insulated (e.g., by an insulation material, an insulation film, etc.) from each other to prevent electric discharge in pickup and transport steps.

In some embodiments, instead of or in addition to LED components, OLED components of different light colors may be used on an image rendering surface as described herein.

Figure 5E:
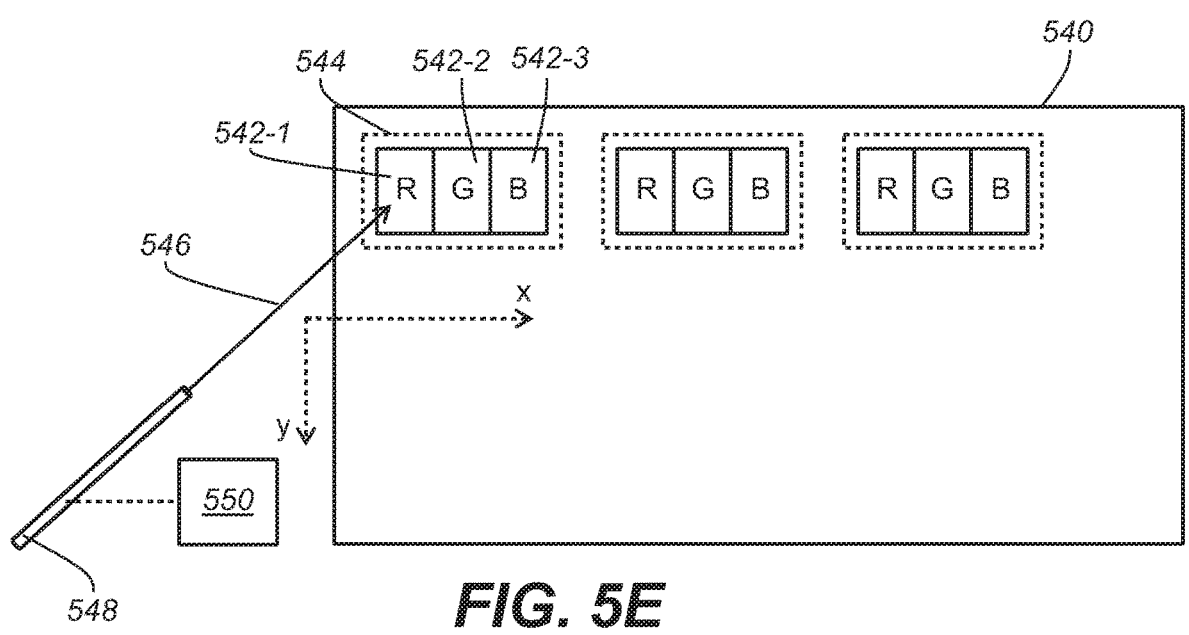

FIG. 5E illustrates an example image rendering area portion 540 that may be used to create at least a part of a pixel tile as described herein. The image rendering area portions (540) may comprise cells (e.g., 542-1, 542-2, 542-3, etc.) coated with light conversion materials such as phosphorous materials, quantum dots, etc. In some embodiments, the cells (e.g., 542-1, 542-2, 542-3, etc.) may be grouped into respective sets that represent pixels (e.g., 544, etc.).

A laser 548 may emit modulated light 546 (e.g., based on image data received at run time of a display application, etc.) that scans in x and y directions. The scanning of the light (546) may be provided by movable mirrors that are housed, for example, in a housing similar to a disco light ball.

Instead of turning on the modulated light (546) at assigned positions of the pixels or sub-pixels in the cells (e.g., 542-1, 542-2, 542-3, etc.) that form a regular pattern, the laser (548) may turn on the modulated light (546) at actual positions of in the cells (e.g., 542-1, 542-2, 542-3, etc.) that forms a non-uniform pattern. These actual positions comprise random displacements of the pixels and/or sub-pixels relative to respective assigned positions in a regular pattern.

In some embodiments, a spatial vibrator 550 such as an acoustic vibrator, a piezoelectric vibrator, etc., can be used to generate vibrations up to a certain magnitude determined based on the overall displacement tolerance. The laser (548) can be mechanically coupled with the spatial vibrator (550) for the purpose of generating the random displacements of the pixels and/or sub-pixels relative to the respective assigned positions.

An image rendering surface (e.g., an outdoor display driven by multiple lasers each of which emit modulated light to their respective pixel tiles, etc.) may be created by combining multiple image rendering area portions such as 540, etc., and multiple lasers such as 548, etc.

7. Random Displacements with Fluidic Self Assembly

In some embodiments, non-uniform, uneven or random displacements of pixels or sub-pixels as described herein may be implemented with fluidic-self-assembly (FSA) technologies. Additionally, optionally, or alternatively, displacements of pixels or sub-pixels as described herein may be implemented with a roll-to-roll (e.g., web, etc.) processes, which may operate in conjunction with FSA processes for high volume manufacturing.

In some embodiments, a tile place system as described herein (e.g., 200 of FIG. 2, etc.) may emboss one or more non-uniform patterns of recesses on a substrate with one or more drums or stamps, for example in a roll-to-roll process. Color LED chips, when positioned in the recesses, are non-uniform in terms of at least one of pitch spacing, density, alignment, sequence order, etc., to avoid visual detection of (e.g., submicron, etc.) misalignments between pixel tiles in an image rendering surface. In some embodiments, irregular recesses embossed on the substrate may be of distinct shapes to be occupied by color LED chips of corresponding distinct shapes.

Figure 5F:
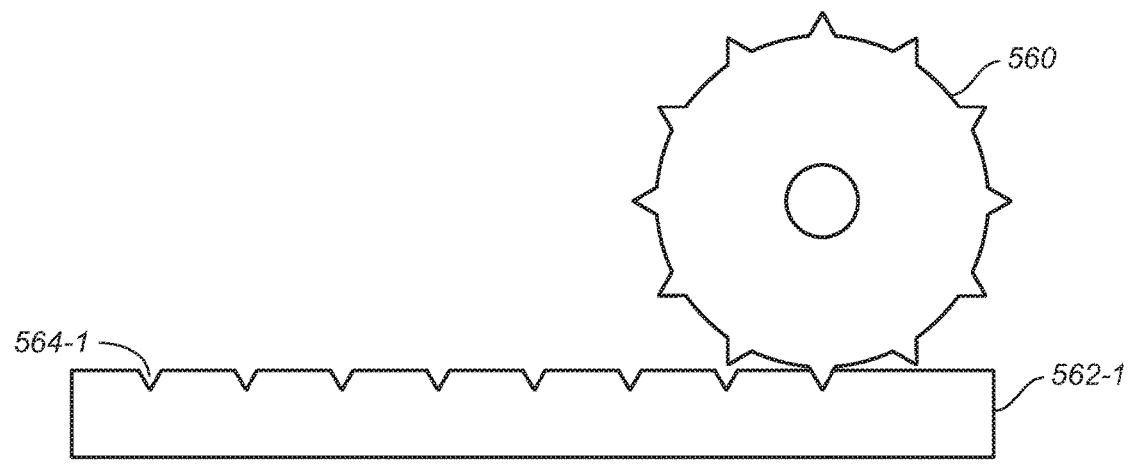
FIG. 5F through FIG. 5J illustrate random displacement of pixels or sub-pixels with fluidic-self-assembly technologies.

FIG. 5F illustrates an example drum 560 used to emboss one or more non-uniform patterns of recesses, whether uniform or irregular, on a substrate 562-1. In some embodiments, the drum (560) may comprise a number of protruding shapes in varied cavity patterns and pitches. The protruding shapes on the stamp (560) can be pressed into the substrate (562-1) and to create recesses 564-1, etc., on the substrate (562-1), for example, while the drum (560) is rolling over (e.g., on top of, toward the right of FIG. 5F, etc.) the substrate (562-1). The drum (560) may be mounted on an axle (not shown). In some embodiments, the drum (560) rotates relative to the substrate (562-1), for example, by exerting a torque through the axle, by a rolling/pulling force acting on the substrate 562-1 towards the left of FIG. 5F, etc. Additionally, optionally, or alternatively, a specific downward pressure, which may be generated by a physical force acting on the axle of the drum (560), can be exerted on the substrate (562-1) by the drum (560) for the purpose of making recesses on the substrate (562-1) that correspond to the protruding shapes on the drum.

Figure 5G:
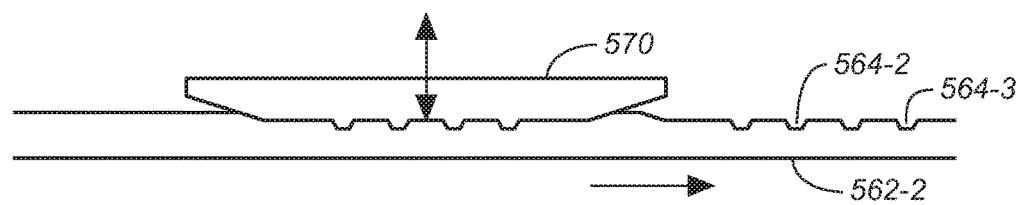

FIG. 5G illustrates an example stamp 570 used to emboss one or more non-uniform patterns of recesses, whether uniform or irregular recesses, on a substrate 562-2. In some embodiments, the stamp (570) may comprise a number of protruding shapes in varied cavity patterns and pitches. The protruding shapes on the stamp (570) can be pressed into the substrate (562-2) and to create recesses 564-2, 564-3, etc., on the substrate (562-2), for example, while the stamp (570) is periodically moving up away from and pressing down against the substrate (562-2). The stamping operation can be done section by section as the substrate (562-2) is being rolled section by section from right to left in FIG. 5G.

A substrate as described herein (e.g., 562-1, 562-2, etc.) may be, but is not necessarily limited to, be a flexible substrate such as a polyethylene terephthalate or PET roll, thermoplastic polymer resin, etc.

In some embodiments, the one or more patterns of recesses on the substrate may comprise multiple patterns of irregular recesses of different distinct shapes. Each pattern in the multiple patterns of irregular recesses may comprise recesses of (i) a distinct shape, such as a triangle, a quadrilateral, a pentagon, a hexagon, a circle, an irregular shape, a shape with a specific key pattern, etc., (ii) size (length, width), and/or (iii) depth (height) within substrate. In various embodiments, recesses of two or more different distinct shapes may be embossed onto the substrate in parallel, in series, or in part in parallel and in part in series. In some embodiments, each drum, stamp, etc., may comprise protruding shapes of a specific type (e.g., triangles, etc.); multiple drums, stamps, etc., may be used serially to create multiple patterns of irregular recesses with multiple different shapes. In some embodiments, a specific drum, stamp, etc., may comprise protruding shapes of two or more specific types (e.g., a combination of rectangles, hexagons and circles, etc.); the specific drum, stamp, etc., may be used to create multiple patterns of irregular recesses with multiple different shapes concurrently.

Figure 5H:
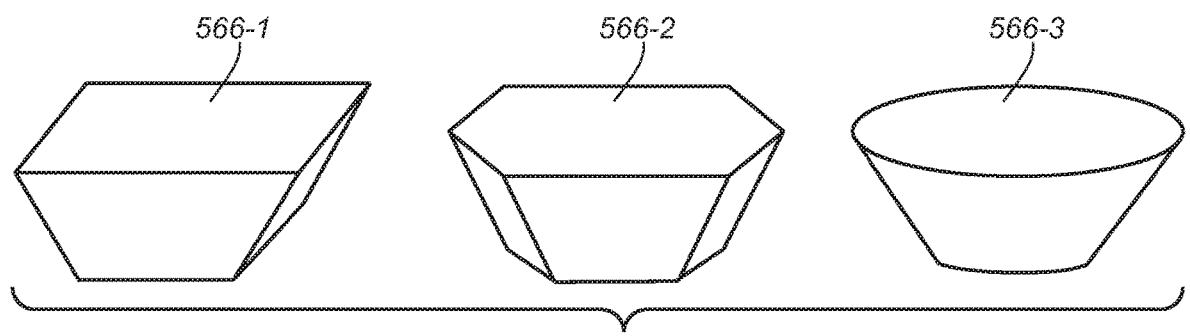

In an example, to perform embossing operations serially, a first drum/stamp can create first recesses of a first distinct shape to be occupied by color LED chips of a first color (e.g., red, etc.) that are of a shape 566-1 of FIG. 5H corresponding to the first distinct shape of the first recesses; a second drum/stamp can create second recesses of a second distinct shape to be occupied by color LED chips of a second color (e.g., green, etc.) that are of a shape 566-2 of FIG. 5H corresponding to the second distinct shape of the second recesses; a third drum/stamp can create third recesses of a third distinct shape to be occupied by color LED chips of a third color (e.g., blue, etc.) that are of a shape 566-3 of FIG. 5H corresponding to the third distinct shape of the third recesses. Each of the first, second and third distinct shapes of recesses may be occupied by LED chips of a corresponding (matched) shape of the shapes (566-1 through 566-3) but not LED chips of other (unmatched) shapes. Alternatively, respectively color LED chips differ in size (e.g., length, width, and/or height), regardless of shape, such that a color LED chip mismatched with a different sized recess will dislodge under continued fluidic flow.

In another example, to perform embossing operations in parallel, a single drum/stamp can create recesses of two or more distinct shapes to be occupied by LED chips of two or more different colors.

In some embodiments, additional drums/stamps that can create recesses of additional distinct shapes can also be used to create additional color primaries (LED chips of additional primary colors) in parallel and/or in series.

Additionally, optionally, or alternatively, a first drum/stamp can create first recesses in a first irregular pattern to be occupied by color LED chips of one or more colors; a second drum/stamp can create second recesses in a second irregular pattern to be occupied by color LED chips of one or more colors; and so on. The first, second, etc., irregular patterns may have varied patterns. As a result, different pixel tile layouts can be obtained after the substrate is filled, populated, etc., with various color LED chips.

Figure 5I:
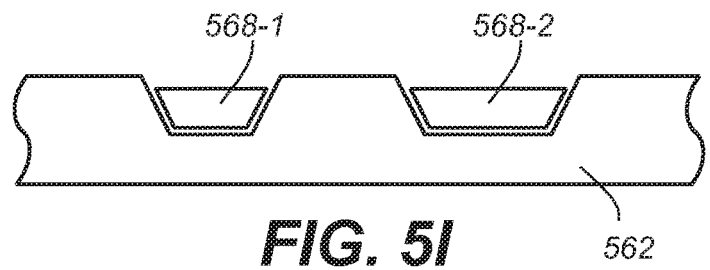

Color LED chips of distinct shapes can be assembled into recesses of corresponding shapes in a substrate (e.g., 562-1, 562-2, etc.) in a variety of methods. In some embodiments, fluidic-self-assembly (FSA) processes can be used to assemble color LED chips onto a substrate. For example, while a substrate 562 as illustrated in FIG. 5I is submerged in a fluid (with a specific buoyancy), color LED chips of a specific color and of a specific shape such as 568-1, 568-2, etc., can be distributed and recirculated over the substrate to sink into recesses of a corresponding shape in the substrate (562). Each color LED chip may represent a pixel or sub-pixel. Accordingly, irregular patterns of pixels or sub-pixels can be created by FSA processes as combined with roll-to-roll (or web) processes for high volume manufacturing.

Additionally, optionally, or alternatively, some or all of color LED chips into recesses may be performed by robotic pick-and-place techniques. For example, any vacant recesses on the substrate after FSA processes can be filled with corresponding color LED chips using robotic pick-and-place techniques as controlled through computer vision.

Figure 5J:
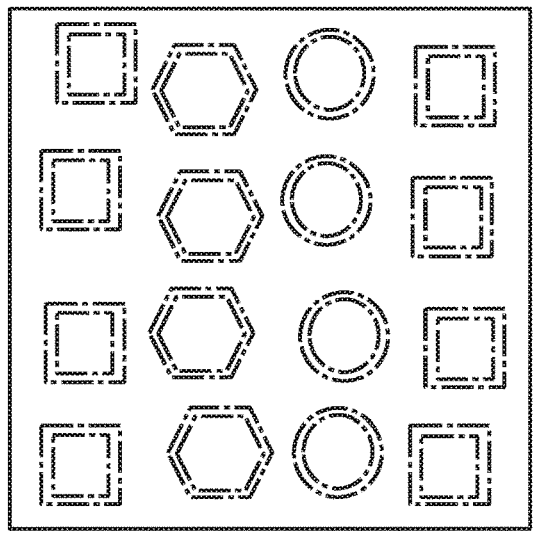

In some embodiments, a flexible interconnect roll (or backplane) or substrate (e.g., PET roll, thermoplastic polymer resin, or the like) is coupled to a color LED chip roll or substrate after FSA processes are applied or overlaid to place color LED chips into the color LED chip roll or substrate. The interconnect roll may include (e.g., transparent, non-transparent, metallic, non-metallic, etc.) conductive traces to electrically couple each color LED chip to a separate controller logic or a switch element. Additionally, optionally, or alternatively, laser drilled vias can be used to place conductive traces. Switch elements, electrodes, electric interconnections, etc., to control operations of individual color LED chips can also be integrated with the FSA processes and/or roll-to-roll processes as described herein to generate a display roll, which can be singulated, cut, divided, etc., into regions to create pixel tiles as illustrated in FIG. 5J. These pixel tiles can be assembled by a tile placement system as described herein into, or can be used directly as, image rendering surfaces, which may include flexible displays, mobile displays, etc. among many different displays. In some embodiments, one or more vias or open pathways (e.g., holes, etc.) can be provided with a recess as described herein (e.g., on a bottom of recess, at a top edge of a recess, etc.). Electrical conducting materials such as metallic conductors, non-metallic conductors (e.g., transparent conductive materials, etc), etc., can be deposited in the vias or open pathways with the recess to provide access for electrical connections to a color LED chip that is located in the recess.

8. Example Display System

Figure 8:
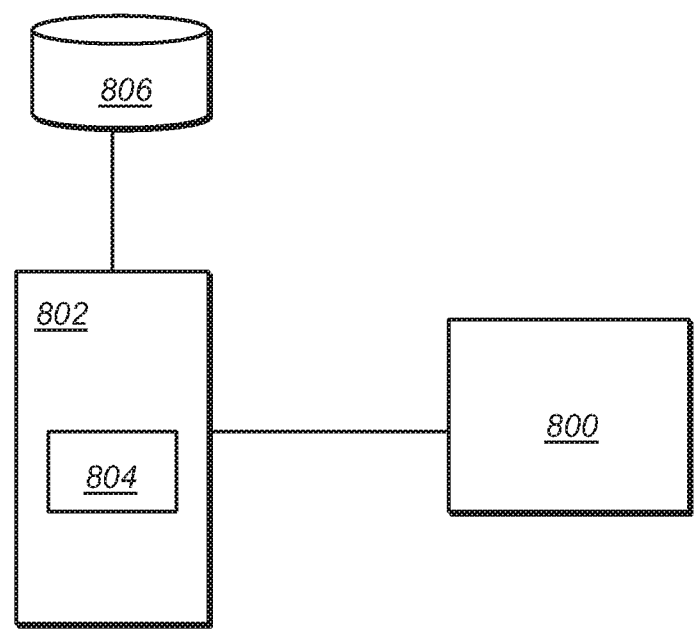
FIG. 8 illustrates an example display system.

FIG. 8 illustrates an example display system that can be used to operate with one or more types of image rendering surfaces as described herein. In some embodiments, display logic 802 may comprise light control logic 804 configured to control generation of modulated light in an image rendering surface 800 in the display system (800) for the purpose of rendering images on the image rendering surface (800). The display logic (802) may be operatively coupled with an image data source 806 (e.g., a set-top box, networked server, storage media or the like, etc.) and is configured to receive image data from the image data source (806). The image data may be provided by the image data source (806) in a variety of ways including from an over-the-air broadcast, or Ethernet, High-Definition Multimedia Interface (HDMI), wireless network interface, devices (e.g., set-top box, server, storage medium, etc.), etc. Image frames received from an internal or external source may be used by the display logic (802) to control the generation of the modulated light in the image rendering surface 800 in the display system. The image frames may be used by the display logic (802) to derive individual or aggregate pixel values in various frames in various resolutions on an image rendering surface as described herein.

9. Example Process Flow

Figure 6:
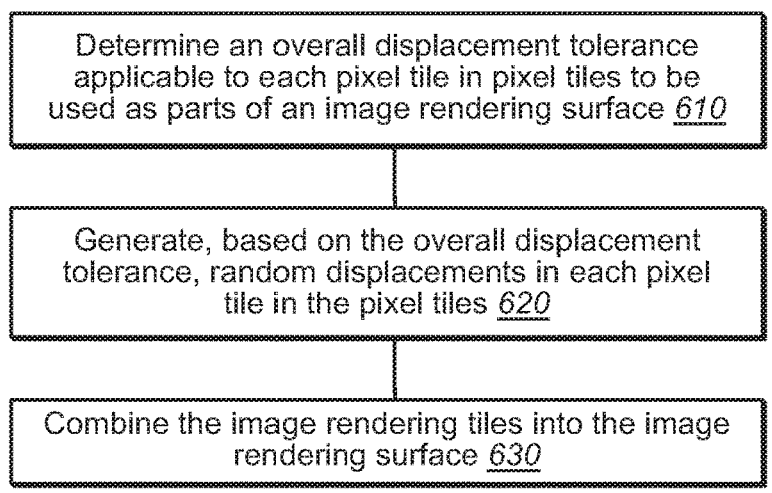
FIG. 6 illustrates an example process flow.

FIG. 6 illustrates an example process flow. In some embodiments, one or more computing devices or components such as a tile placement system 200 of FIG. 2, etc., may perform this process flow. In block 610, the tile placement system (200) determines an overall displacement tolerance applicable to each pixel tile in a plurality of pixel tiles to be used as parts of an image rendering surface. Here, each pixel tile in the plurality of pixel tiles comprises a plurality of sub-pixels.

In block 620, the tile placement system (200) generates, based on the overall displacement tolerance, random displacements in each pixel tile in the plurality of pixel tiles.

In block 630, the tile placement system (200) combines the plurality of image rendering tiles into the image rendering surface.

In an embodiment, the random displacements represents displacements of pixels from assigned positions of the pixels; the assigned positions form a regular pattern.

In an embodiment, the random displacements represents displacements of sub-pixels from assigned positions of the sub-pixels; the assigned positions form a regular pattern.

In an embodiment, sub-pixels in at least one pixel tile in the plurality of pixel tiles represent a plurality of pixels each of which comprises a subset of one or more of the sub-pixels in the at least one pixel tile. In an embodiment, a pixel in the plurality of pixels comprises multiple sub-pixels; the multiple sub-pixels in the pixel in the plurality of pixels have fixed spatial relationships among the sub-pixels in the pixel.

In an embodiment, a pixel in the plurality of pixels comprises multiple sub-pixels; the multiple sub-pixels in a pixel in the plurality of pixels have variable spatial relationships among the sub-pixels in the pixel.

In an embodiment, at least one pixel tile in the plurality of pixel tiles comprises variable densities, heights, widths, pitches, etc., of pixels within the at least one pixel tile.

In an embodiment, at least one pixel tile in the plurality of pixel tiles comprises variable densities, heights, widths, pitches, etc., of sub-pixels within the at least one pixel tile.

In an embodiment, the overall displacement tolerance represents errors of a physical device used to place individual sub-pixels onto a pixel tile in the plurality of pixel tiles. In an embodiment, the overall displacement tolerance represents errors of a physical device used to place individual pixels onto a pixel tile in the plurality of pixel tiles. In an embodiment, the physical device as referenced herein is one or more of lasers, pixel-placement modules, sub-pixel placement modules, nanotubes, shadow masks, etc.

In an embodiment, the overall displacement tolerance represents errors of a tile placement system used to place individual pixel tiles onto the image rendering surface.

In an embodiment, at least one pixel tile comprises one or more of color pigments, phosphorous materials, quantum dots, nanotubes, light emitting diodes, organic light emitting diodes, etc.

In some embodiments, process flows involving operations, methods, etc., as described herein can be performed through one or more computing devices or units.

In an embodiment, an apparatus comprises a processor and is configured to perform any of these operations, methods, process flows, etc.

In an embodiment, a non-transitory computer readable storage medium, storing software instructions, which when executed by one or more processors cause performance of any of these operations, methods, process flows, etc.

In an embodiment, a computing device comprising one or more processors and one or more storage media storing a set of instructions which, when executed by the one or more processors, cause performance of any of these operations, methods, process flows, etc. Note that, although separate embodiments are discussed herein, any combination of embodiments and/or partial embodiments discussed herein may be combined to form further embodiments.

10. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 7:
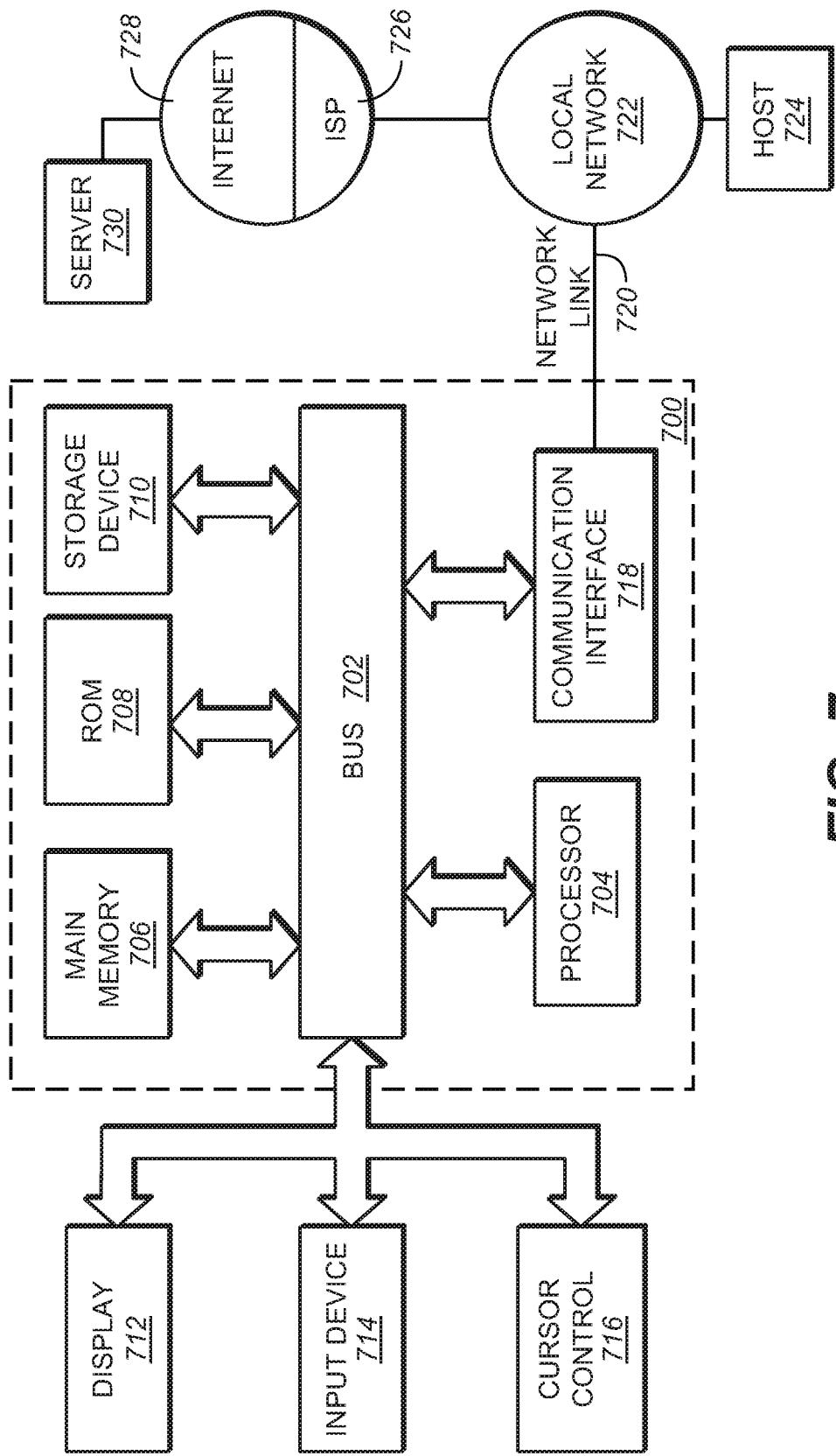
FIG. 7 illustrates an example hardware platform on which a computer or a computing device as described herein may be implemented, according a possible embodiment of the present invention.

For example, FIG. 7 is a block diagram that illustrates a computer system 700 upon which an embodiment of the invention may be implemented. Computer system 700 includes a bus 702 or other communication mechanism for communicating information, and a hardware processor 704 coupled with bus 702 for processing information. Hardware processor 704 may be, for example, a general purpose microprocessor.

Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Such instructions, when stored in non-transitory storage media accessible to processor 704, render computer system 700 into a special-purpose machine that is customized to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a liquid crystal display, for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques as described herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution.

11. Equivalents, Extensions, Alternatives and Miscellaneous

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for creating an image rendering surface from a plurality of pixel tiles,
wherein each pixel tile in the plurality of pixel tiles comprises a plurality of pixel lines with a plurality of sub-pixels, wherein each of the plurality of pixel tiles is configured to be placed such that the sub-pixels or pixels in the pixel tiles are arranged in a regular pattern to form the image rendering surface, wherein misalignments between the pixel tiles cause deviations of the sub-pixels or pixels from the regular pattern, and wherein a pixel tile level misalignment between two pixel tiles is measured as a difference between corresponding pixel lines located in the two pixel tiles, the method comprising:
measuring pixel tile level misalignments in pixel tile placement operations performed by a tile placement device;
determining an overall displacement tolerance applicable to each pixel tile in a plurality of pixel tiles to be used as parts of the image rendering surface, wherein the overall displacement tolerance is determined as a specific group value among the measured pixel tile level misalignments;
generating, based at least in part on the overall displacement tolerance, non-uniform displacements of sub-pixels or pixels in each pixel tile in the plurality of pixel tiles; and
combining the plurality of pixel tiles to create the image rendering surface.

2. The method of claim 1, wherein the displacements represent random displacements of sub-pixels from assigned positions of the sub-pixels, and wherein the assigned positions form a regular pattern.

3. The method of claim 1, wherein sub-pixels in at least one pixel tile in the plurality of pixel tiles represent a plurality of pixels each of which comprises a subset of one or more of the sub-pixels in the at least one pixel tile.

4. The method of claim 3, wherein a pixel in the plurality of pixels comprises multiple sub-pixels, and wherein the multiple sub-pixels in the pixel in the plurality of pixels have fixed spatial relationships among the sub-pixels in the pixel.

5. The method of claim 3, wherein a pixel in the plurality of pixels comprises multiple sub-pixels, and wherein the multiple sub-pixels in a pixel in the plurality of pixels have variable spatial relationships among the sub-pixels in the pixel.

6. The method of claim 1, wherein at least one pixel tile in the plurality of pixel tiles comprises variable densities, heights, widths, or pitches of sub-pixels within the at least one pixel tile.

7. The method of claim 1, wherein the overall displacement tolerance represents errors of a physical device used to place individual sub-pixels or pixels onto a pixel tile in the plurality of pixel tiles.

8. The method of claim 7, wherein the physical device is one or more of lasers, pixel-placement modules, sub-pixel placement modules, or shadow masks.

* * * * *